United States Patent [19]
Wechsler et al.

[11] Patent Number: 4,845,685
[45] Date of Patent: Jul. 4, 1989

[54] DIGITAL PHASE-LOCKED LOOP

[75] Inventors: Robert E. Wechsler, Great Neck; Joseph A. Horch, Melville, both of N.Y.

[73] Assignee: Unisys Corporation, Blue Bell, Pa.

[21] Appl. No.: 74,658

[22] Filed: Jul. 17, 1987

[51] Int. Cl.$^4$ .............................................. G01S 9/68
[52] U.S. Cl. ..................................... 367/97; 342/195; 329/122
[58] Field of Search ..................... 367/97, 90; 342/104, 342/115, 103, 195; 329/122; 331/DIG. 2, 3, 1 A, 25

[56] References Cited

U.S. PATENT DOCUMENTS

| | | | |
|---|---|---|---|
| 4,077,016 | 2/1978 | Sanders et al. | 331/DIG. 2 X |
| 4,145,914 | 3/1979 | Newman | 367/97 X |
| 4,339,731 | 7/1982 | Adams | 331/1 A |
| 4,400,667 | 8/1983 | Belkin | 331/DIG. 2 |
| 4,409,562 | 10/1983 | Kurihara | 329/122 X |
| 4,504,799 | 3/1985 | Elmis et al. | 331/1 A |
| 4,535,459 | 8/1985 | Hogge, Jr. | 331/1 A X |
| 4,539,524 | 9/1985 | Goode | 329/122 X |
| 4,594,563 | 6/1986 | Williams | 331/1 A |

Primary Examiner—Thomas H. Tarcza
Assistant Examiner—Tod Swann
Attorney, Agent, or Firm—Albert B. Cooper; Arnold L. Albin

[57] ABSTRACT

A digital phase-locked loop provides substantially real-time measurements of frequency differences between an applied input signal and a reference signal. The system is especially adapted for the measurement of Doppler frequency shift in a Doppler sonar detection system. A two phase clock receives a reference signal and generates complementary clock signals. A phase-frequency detector receives an applied input signal containing a frequency shift and a further reference signal derived and applied in closed loop fashion. Frequency and phase discrepancies between the applied input signal and a second reference signal are gated to a counter to increment the frequency count or blank the frequency count for a predetermined period, thereby to synchronize the second reference signal with the applied input signal in frequency and phase. The frequency difference is detected by counting pulses gated into a divide by N counter thereby to advance or retard the phase of the second reference signal to match the incoming signal under observation. Since no filtering or integration is required, the circuit obtains loop lock within one cycle of the input frequency. An embodiment adapted for pulsed Doppler sonar detection systems employs a secondary counter which is incremented or decremented in accordance with the phase error signal to provide a high resolution low jitter real-time measure of frequency shift.

11 Claims, 4 Drawing Sheets

DIGITAL PHASE-LOCKED LOOP

The U.S. Government has rights in this invention under Contract N00030-76-C-0082.

BACKGROUND OF THE INVENTION

1. Field of the Invention

The present invention relates to phase-lock loop circuits and more specifically to a digital phase lock loop circuit useful for measuring Doppler frequency shift.

2. Description of the Prior Art

Analog phase-locked loop circuits have found wide application in frequency measurement, frequency synthesizers, and high sensitivity tracking receivers. However, analog systems suffer from sensitivity to DC drifts and component saturation, and a need for calibration and periodic adjustments. Digital systems do not suffer from these difficulties and in addition permit real time processing of signals. An analog phase-lock loop consists of three major functional units: (1) a phase detector, (2) a loop filter, and (3) a voltage-controlled oscillator (VCO). A block diagram of a conventional analog phase-locked loop is shown in FIG. 1. The incoming signal whose phase or frequency is to be tracked is mixed with a locally generated sine wave generated by the voltage-controlled oscillator to produce a phase error voltage proportional to the instantaneous phase difference. This error voltage is filtered and used to control the instantaneous frequency of the voltage controlled oscillator. In realizing such a system with analog circuitry, the phase detector is generally a balanced mixer, the loop filter may be a simple RC low-pass circuit, and the VCO may be tuned by adjusting the bias voltage on a varicap or other element in the tuned circuit controlling the resonant frequency.

Early efforts at replacing the analog components with digital ones are reported by William C. Lindsey and Chak Ming Chie in A Survey of Digital Phase-Locked Loops, *Proc. IEEE* vol. 69, pp. 410–431, April 1981. However, systems disclosed therein simply replaced the analog components with equivalent digital ones.

Th present invention provides an improved digital phase-lock loop circuit, capable of providing essentially instantaneous frequency measurements, which provides high resolution, valid data over short received intervals, and is capable of locking within one cycle of the reference frequency source, since there is no filtering of the error signal.

SUMMARY OF THE INVENTION

A reference signal of frequency $2Nf_o$ is used to generate a two-phase clock. The phase one clock, with a frequency of $Nf_o$, is applied to a divide-by-N counter, the output being $f_o$, and a voltage output at this frequency is applied to one input of a phase comparator. A signal to be measured, $f_o$, is applied to a second input of the phase detector. The counter frequency output is corrected to match the measured signal input in frequency and phase by adding or blocking pulses to the divide by N counter. Pulses are added by the phase-two clock during the period when the output of the phase comparator requires an increase in frequency. Pulses of the phase-one clock are blocked from application to the divide-by-N counter during the time that the detector commands a decrease in frequency. Each pulse added or blocked corresponds to a 1/N correction in phase.

In a further embodiment, a secondary counter increments the count with each phase-two pulse added and decrements the count with each phase-one clock pulse blocked. The resultant count is N times the frequency shift.

DESCRIPTION OF THE PREFERRED EMBODIMENTS

Figure 1:
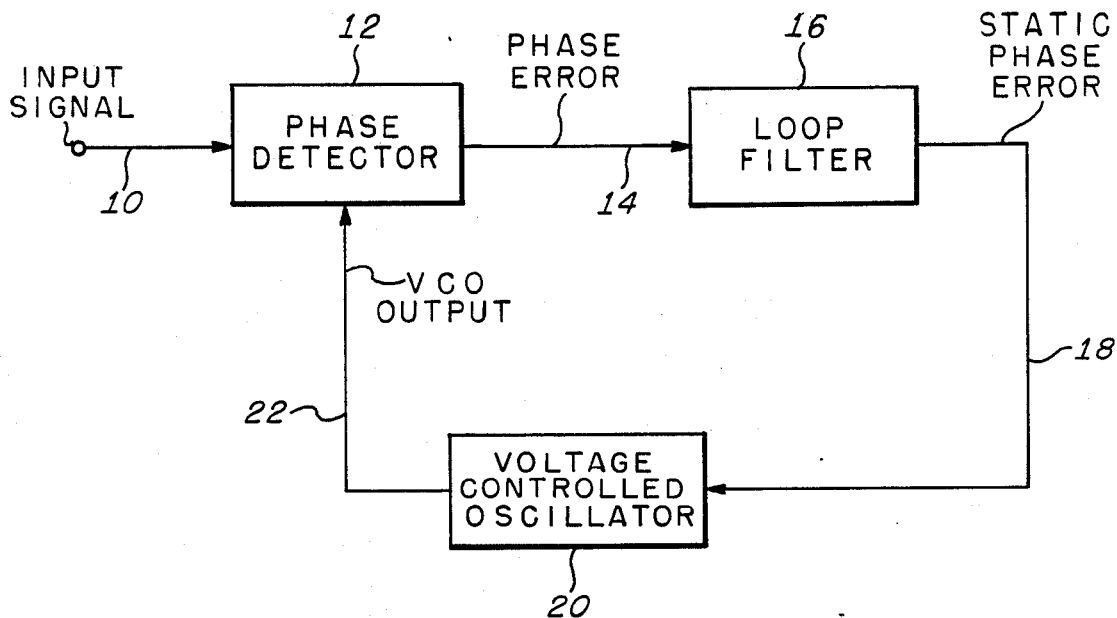
FIG. 1 is a schematic block diagram of an analog phase-locked loop of the prior art.
Figure 2:
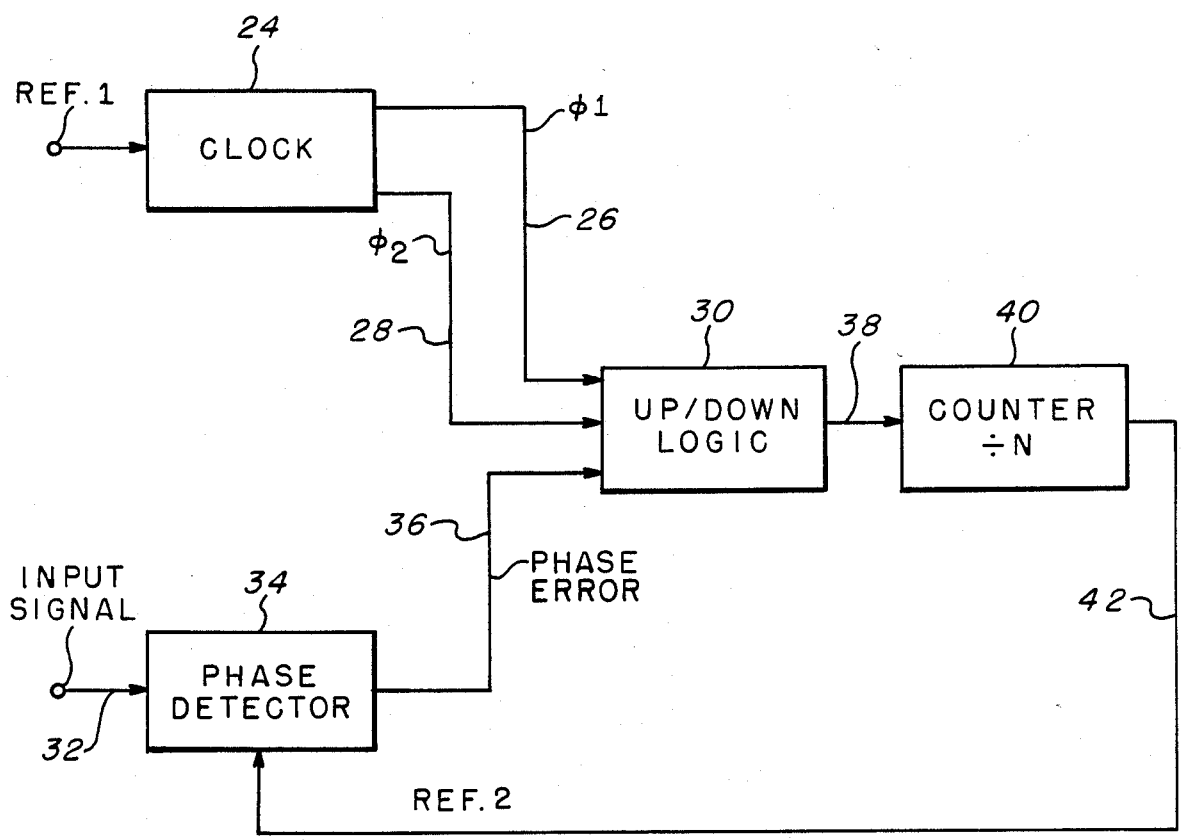
FIG. 2 is a schematic block diagram of a preferred embodiment of a digital phase-locked loop of the present invention.

A phase-locked loop circuit in accordance with the present invention is shown in FIG. 2. A two-phase clock 24 is energized by a digital input signal REF. 1 and provides complementary outputs $\phi 1$, $\phi 2$ on lines 26 and 28, respectively. The clock signals $\phi 1$ and $\phi 2$ are applied to a logic circuit 30. Clock signals $\phi 1$ and $\phi 2$ are selectively applied by logic circuit 30 on line 38 to $\div/N$ counter 40. The output of counter 40, which comprises a further reference signal REF. 2, is coupled on line 42 to phase detector 34. An input signal 32 to be measured is applied to a second input of phase detector 34. Detector 34 compares the input signals on lines 32 and 42 and develops a phase error signal which is coupled on line 36 to logic block 30. Detector 34, logic 30, and counter 40 are connected in closed loop fashion so that the signal on line 42 is urged to substantial identity with the input signal on line 32.

Figure 3:
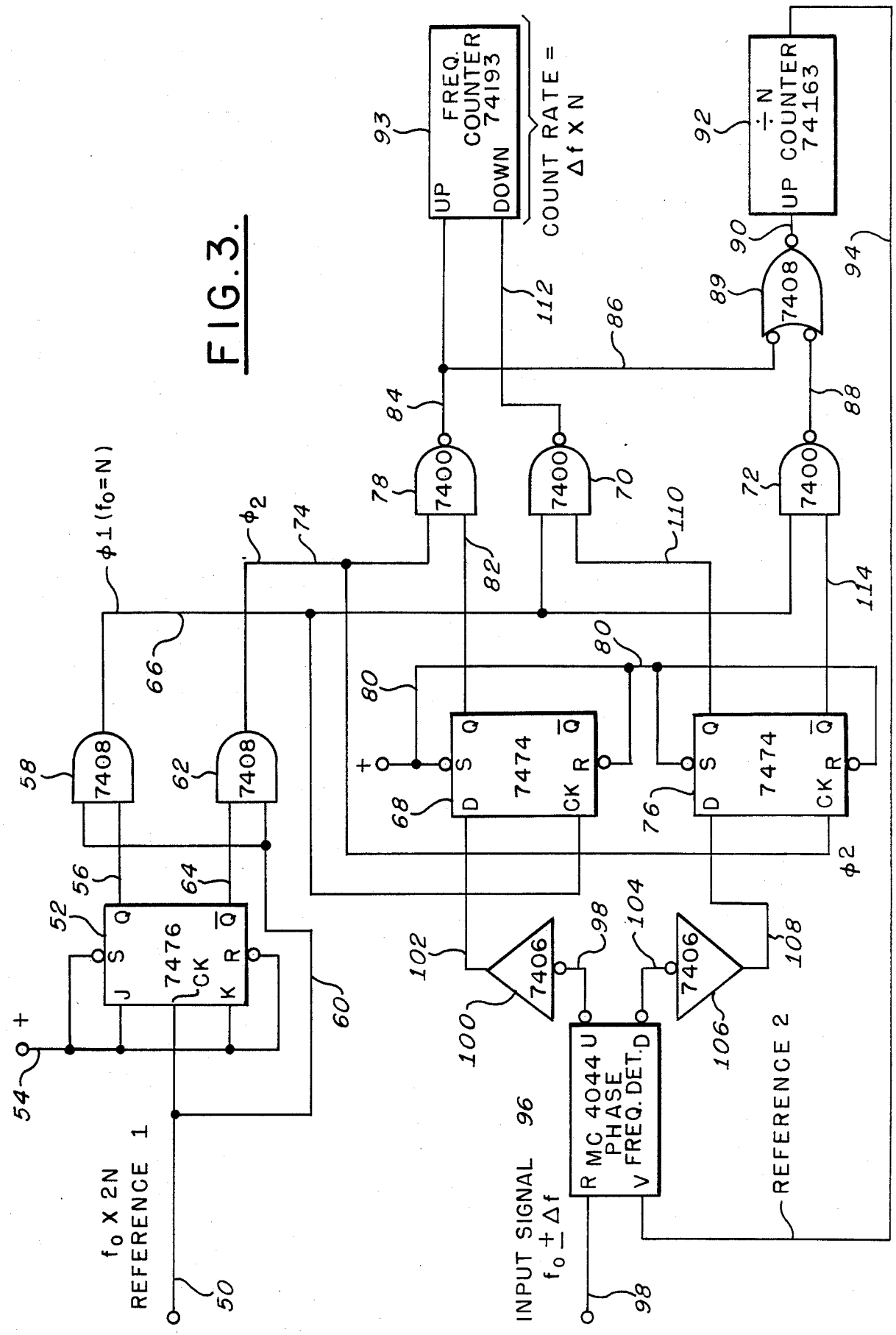
FIG. 3 is a schematic circuit diagram showing the phase-locked loop of the present invention and a secondary frequency counter.

Referring now to FIG. 3, the circuit elements of FIG. 2 are shown in detail. Utilization of a phase-locked loop generally requires some a priori knowledge of the input frequency to be measured. In this case, the desired signal is a frequency $f_o$ having a deviation of $\pm \Delta f$. A reference frequency of $2Nf_o$ is applied to input 50 and to the clock input of a bi-stable multivibrator 52, of the type generally known as J-K flip-flop. Terminals S and R, denoting the set and reset inputs, respectively, and terminals J and K, denoting the signal inputs, are tied to a source of voltage 54. The Q output, representing a positive output pulse, is applied via lead 56 to one input of logic element 58, which may comprise an AND gate. The input signal at terminal 50 is also applied on lead 60 to a second input of gate 58 and to an input of similar AND gate 62. A complementary output $\overline{Q}$ is applied on line 64 to a second input of gate 62. The output $\phi 1$ on line 66 from gate 58 is applied to the clock input CK of type D flip-flop 68 and to one input of NAND gates 70 and 72. The $\phi 2$ output of gate 62 is applied on lead 74 to a further type D flip-flop 76 and to one input of NAND gate 78. The respective set and reset inputs of flip-flops 68 and 78 are tied via lead 80 to a source of positive voltage. An output Q of flip-flop 68 is coupled on line 82 to a second input of gate 78. The output of gate 78 is applied via lead 84 and lead 86 to one input of AND gate 89. The output of gate 72 is coupled on lead 88 to a second input of gate 89 and the output thereof coupled on lead 90 to increment counter 92. The frequency output of counter 92 is applied on lead 94 in closed loop fashion to the V input of phase detector 96.

The input signal to be measured, which is a subharmonic of the reference signal applied to terminal 50, with incremental perturbations representative of frequency or phase deviations, is applied at terminal 98 to input R of detector 96. Detector 96 senses the frequency and phase differences of the signals applied to inputs R and V and provides an output corresponding thereto for incrementing counter 92 at terminal U and for blocking the clock count at terminal D. When the relationship of the input signals is such as to require an increase in count, a signal appears at terminal U of detector 96 and is applied on line 98 to inverter 100, the output of which is applied on line 102 to the D input of type D flip-flop 68. When the output of detector 96 is such as to require blocking the frequency count, the output appears at terminal D and is applied on lead 104 through inverter 106 and lead 108 to the D input of flip-flop 76.

The Q output of flip-flop 68 is gated with the phase two clock at NAND gate 78 for increasing frequency counter 92. The Q output of flip-flop 76 is applied on lead 110 to gate 70 and combined with the $\phi 1$ signal at gate 70 to provide an output on lead 112 for an auxiliary counter whose purpose is to be described. The output at terminal Q of flip-flop 76 is applied on line 114 to one input of gate 72 where it is combined with the $\phi 1$ clock to provide an output on lead 88.

The present invention may be implemented by using fully conventional digital components, or the logical functions may be implemented in a digital computer. While the components shown in the circuit diagrams are representative of those which may be employed, they are representative only, and are not to be considered limiting. Having described the structure of a preferred embodiment, the operation of the circuit will now be described.

Figure 4:
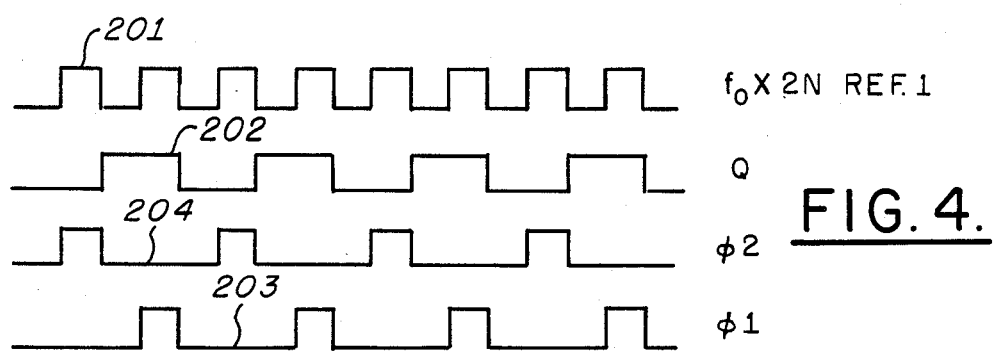
FIGS. 4–9 show waveforms obtained at various points on the circuit of FIG. 3.

A reference signal of frequency 2Nfo is used to generate a two-phase clock. J-K flip-flop 52 acts as a divide by 2 counter. The first negative-going transition causes the Q output to go high. The signal level at Q remains high until the input see another negative-going pulse. Then the Q output drops to a logic low. The action to make a complete output cycle requires two clock pulses, so that the input frequency is divided by a factor of 2. The output Q is complementary to that of the Q output. FIG. 4 shows the waveforms of the above mentioned signals. Waveform 201 represents the input frequency REF. 1 which is at a rate twice that of the input frequency to be measured ($f_0 \pm \Delta f$). The Q output of flip-flop 52 is shown by waveform 202. The input reference at terminal 50 is applied with the Q signal on line 56 to AND gate 58 to produce the phase-one clock $\phi 1$ at line 66. This is shown by waveform 203. In a similar manner the reference signal when combined with the complementary signal Q applied to AND gate 62 produces the phase 2 clock, $\phi 2$, shown by waveform 204.

Figure 5:
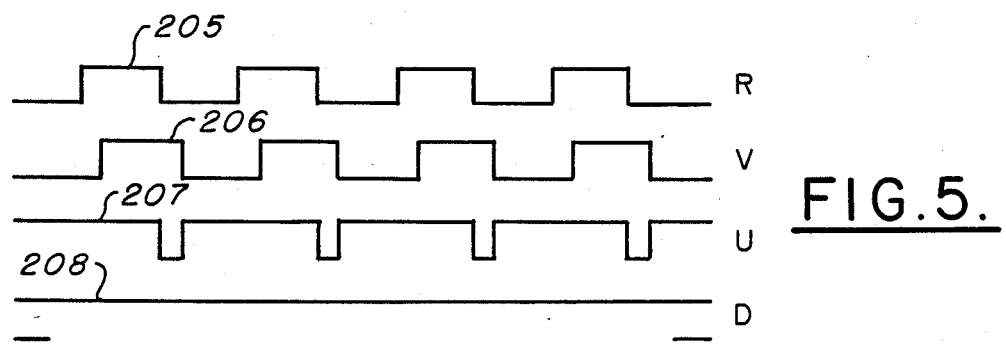
Figure 6:
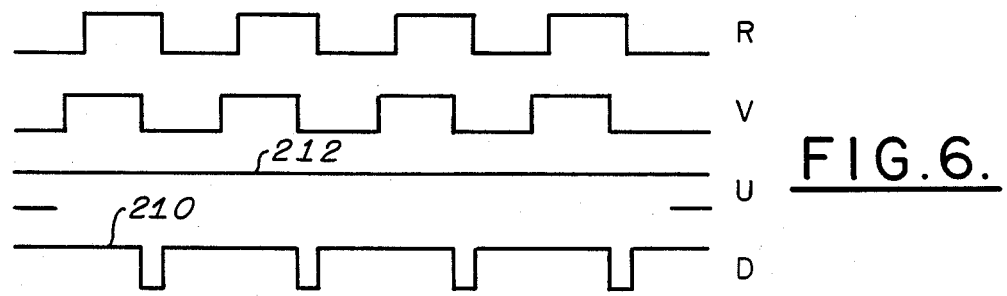
Figure 7:
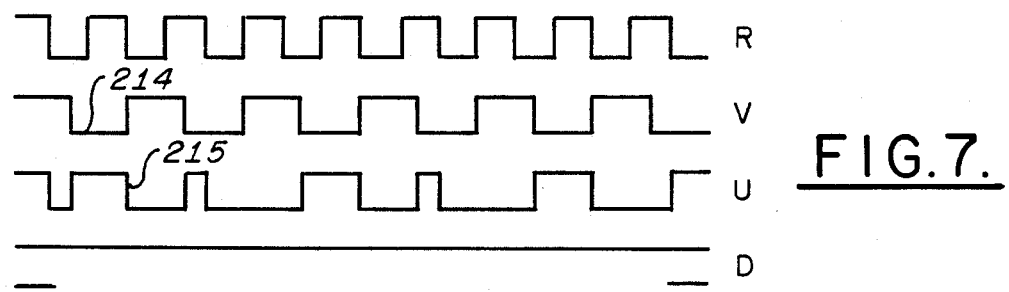

The phase-frequency detector 96 compares the input frequency $f_0 \pm \Delta f$ applied to input R against a reference REF. 2 applied to input V, developed in the closed loop circuit, and generates an error signal at output terminals U or D proportional to a phase or frequency difference of the two signals. When the two inputs R and V are coincident in frequency and phase, no error signal is generated at U or D. If the two inputs are of the same frequency, but the signal at input V is lagging in phase with respect to the input signal at R, the output at terminal U is a periodic waveform whose duty cycle is proportional to the phase difference between the signals applied to R and V. Referring now to FIG. 5, an R signal is applied as shown at waveform 25 and a V signal at waveform 206. The difference appears as a pulse waveform as shown at reference numeral 207. The D output, shown at waveform 208 is seen to be a constant voltage. Similarly, if signal V is leading with respect to signal R, a periodic waveform appears at terminal D, as shown at 210 of FIG. 6. The output at terminal Q is a constant voltage, waveform 212. If the R and V inputs are separated by a fixed frequency difference, the outputs at U or D will be a pulsed waveform with a duty cycle proportional to the differences for R>V or V>R, respectively, as shown at waveforms 214 and 215 of FIG. 7. FIG. 7 shows a case where the signal R is of a greater frequency than the signal V. Since the phase-frequency detector 96 responds only to transitions of the input waveforms, the resultant phase error signal is independent of the input waveform duty cycle and amplitude. Loop lock up will occur when the negative transitions of both the R and V inputs coincide.

The phase error outputs U and D of detector 96 are applied to inverters 100 and 104 and to type D flip-flops 68 and 76, respectively. A type D flip-flop operates to transfer data on the D input to the Q output only when the clock line is high. If the clock line is high, then the Q output will follow changes in the input D signal. When the D input goes high, then the Q output will go high. Similarly, when the D input goes low, then the output follows. If the clock line is low, then the Q output will retain the last data that existed on the D input at the instant the clock line dropped to a logic low. Thus, when the input V is lagging in frequency or phase with respect to the input R, a series of pulses whose duration is proportional to the error is applied to the D input of flip-flop 68. When the clock signal $\phi 1$ goes high, then flip-flop 68 is triggered at the rising edge of the clock pulse. The output Q will stay high until the input at terminal D goes low. Thus, referring to FIG. 9, which represents the UP COUNT mode, waveform 300 represents the signal applied to the D input. Waveforms 302 and 304 represent the $\phi 1$ and $\phi 2$ clock signals, respectively. Since the phase error output U is at a logic low, when inverted it appears as a logic high at input D. Upon the rising edge of the first clock pulse 306 flip flop 68 is triggered producing the Q output denoted by waveform 308. So long as waveform U remains at a logic low, the Q output remains at a logic high. On the leading edge of the first clock pulse following termination of phase error signal U shown at reference point 310 the Q output returns to a logic low.

Figure 8:
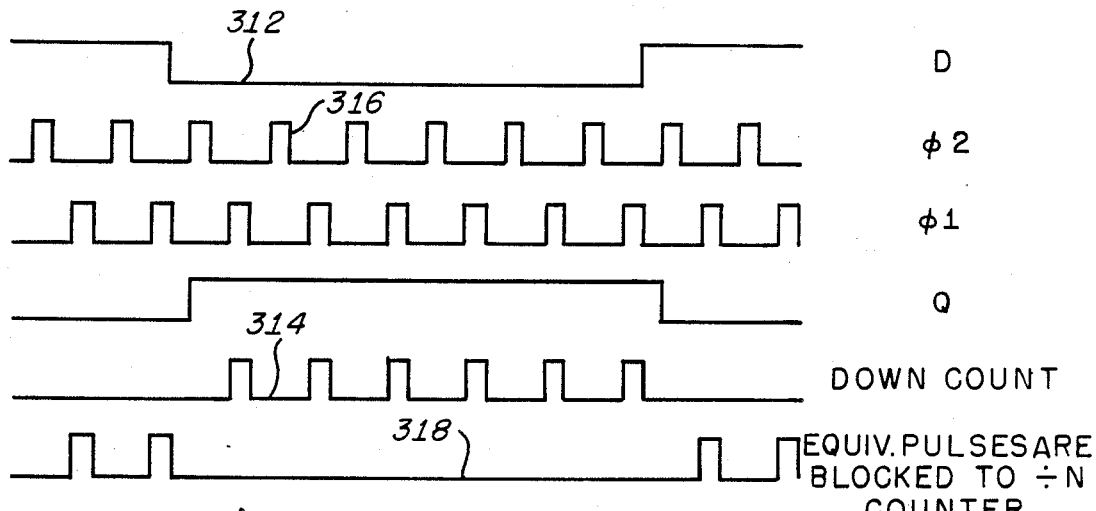

In a like manner, referring to FIG. 8, the operation of the DOWN COUNT mode is shown. Signal 312 represents the output of D terminal of detector 96 which when inverted applies a logic high to input D of flip flow 76. Thus, an output appears at the Q terminal of flip-flop 76 which corresponds in duration to a phase error of waveform 312.

The signals on lines 74 and 82, representing the $\phi 2$ clock output of gate 62 and the Q output of flip-flop 68, are combined in NAND gate 78. The resultant output, corresponding to the Q2 pulse train 304 appears as waveform 320 in FIG. 9. Simultaneously, the $\phi 1$ clock input from gate 58 and the Q output of flip-flop 76 are applied to NAND gate 72, resulting in waveform 314 of FIG. 8. AND gate 89 accepts the signals applied on lines 86 and 88 and applied the output to counter 92.

Figure 9:
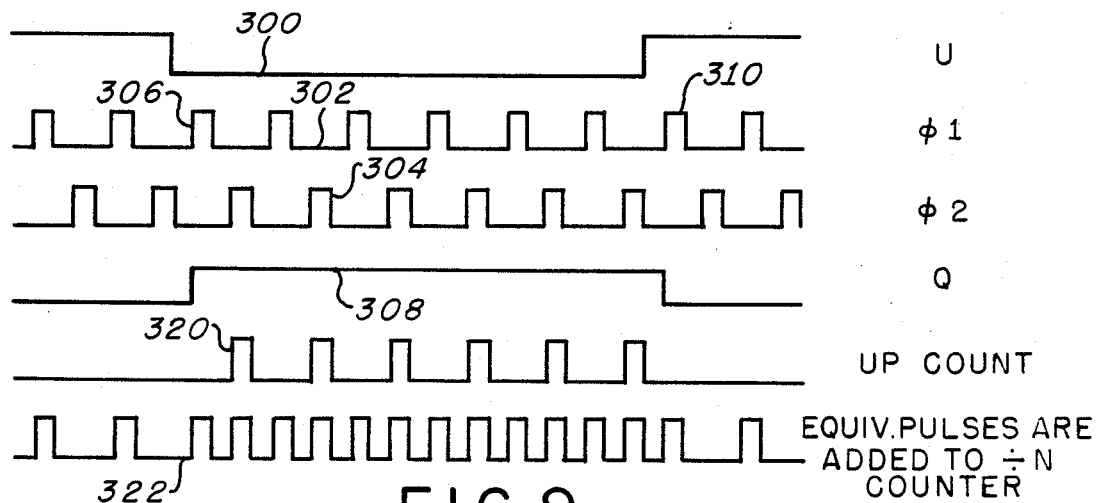

Since both signals must be present in order for counter 92 to be incremented, and since when detector 96 provides an output at terminal U, the $\phi1$ clock signal will be present on line 88 and the $\phi2$ clock signal will be present on line 86, the resultant waveform applied to counter 92 will be as shown at reference numeral 322 of FIG. 9. When detector 96 provides a phase error output at terminal D, represented by waveform 312 of FIG. 8, a logic high appears at the D input of flip-flop 76. Thus, whenever flip-flop 76 is clocked by the $\phi2$ signal, represented by waveform 316, the $\bar{Q}$ output on line 114 will be at a logic 0. Therefore, NAND gate 72 will produce a logic 0 on line 88, and result in inhibiting the transmittal of the $\phi1$ or $\phi2$ clock pulses through gate 89 to counter 92. This is shown by waveform 318 of FIG. 8. Thus, it may be seen that pulses are added from the $\phi2$ clock during the period that output U of detector 96 is low, and that pulses of the $\phi1$ and $\phi2$ clocks are blocked during the time that output signal D from detector 96 is low. Each pulse added or blocked corresponds to $1/N \pm 360°$ correction in phase where N is the frequency divider of counter 92.

A further embodiment is particularly adapted to measure a Doppler frequency shift and to provide a direct, high resolution measurement thereof. FIG. 3 shows a supplementary frequency counter 93. Counter 93 is of the up/down type and may be incremented or decremented in response to signals from logic gates 78 and 70 applied to corresponding input terminals UP and DOWN on lines 84 and 112, respectively. As described in the foregoing analysis of counter 92, an output from terminal U of detector 96 will result in adding a train of pulses at the $\phi2$ clock rate at line 84 to the UP terminal of counter 93. When detector 96 provides an output at the D terminal, this results in a logic high at line 110 applied to NAND gate 70. Thus, each time a clock pulse from the $\phi1$ clock is received, gate 70 will output a corresponding pulse on line 112. At the same time, since the signal on line 82 will be a logic low, the transmittal of the $\phi2$ pulses on lead 84 will be inhibited. Therefore, there will result a down count in counter 93. The net result is a count rate of N times the frequency shift $\Delta f$. This will provide an essentially instantaneous reading of frequency shift with a resolution of 1/N of a cycle of frequency shift and a jitter of one pulse at loop lock.

It may be seen that the present invention provides the following advantages:

(1) loop lock obtained within one cycle of input frequency, since there is no filtering of the error signal.

(2) No analog components are used.

(3) Obviates the need for a VCO, with its drift problems, by counting pulses gated into a divide by N counter, to advance or retard the phase of the reference signal to match the incoming signal.

(4) Provides high resolution, low jitter measurements of frequency.

(5) Locks within one pulse.

Figure 10:
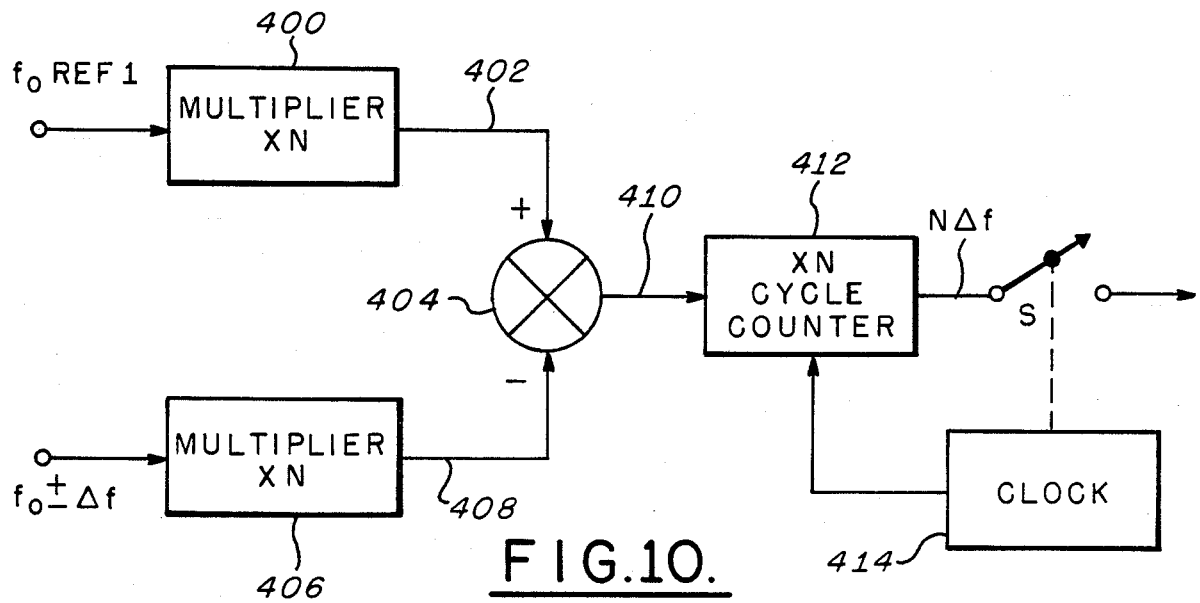
FIG. 10 is a further embodiment of the present invention adapted for use in detecting Doppler frequency shifts.

A further embodiment is shown in FIG. 10 for use in a Doppler sonar detection system. A first reference signal $f_0$ at the approximate frequency of the desired input signal is applied to multiplier 400 which is selected as a function of the desired frequency shift. Representative factors of N are 240, 272, or 306. The output of multiplier 400 is applied on line 402 to a digital phase-lock loop 404. A frequency signal $f_0$, shifted in frequency by a Doppler shift $\pm \Delta f$, is applied to a second multiplier 406 and the multiplied output via lead 408 to phase lock circuit 404. The output of phase lock circuit 404 appears on lead 410 and is applied to frequency counter 412 which provides a real-time count of the Doppler frequency shift $\Delta f$ multiplied by the preselected factor N. A clock 414 clears and activates counter 412 periodically in accordance with a desired Doppler sampling rate, so as to allow the counter sufficient time to lock on frequency when a received signal is interrupted. Switch S represents the interrupted output of frequency counter 412. Typically, a sample rate of 50 miliseconds would be utilized, corresponding to the leading and trailing edges of the Doppler gate. The reference signal REF.1 may be obtained from a reference crystal oscillator while the received output signal from a sonar detector ($f_0 \pm \Delta f$) is applied to obtain the Doppler shifted signal. Provisions may be made for changing the reference frequency and the multiplier factor in accordance with a conventional frequency shift keyed operation. By clearing the Doppler frequency counter on the rising edge of Doppler gate, the counter will obtain a reading while the gate is at a logic high. Since valid data is present a few cycles before the gate goes to a logic high, the phase-locked loop will be in lock when the Doppler gate becomes active, resulting in essentially real-time readings without loss of any Doppler cycles. Any digital phase detector capable of providing a gating signal proportional to phase difference may be used for detector 404.

While the invention has been described in its preferred embodiments it is to be understood that the words which have been used are words of description rather than limitation and that changes may be made within the purview of the appended claims without departing from the true scope and spirit of the invention in its broader aspects.

We claim:

1. A digital phase-lock loop circuit, comprising:
   reference signal means for providing a first digital reference signal at a predetermined frequency,
   digital logic means responsive to said first digital reference signal for providing first and second complementary signals synchronized therewith,
   digital logic comparator means responsive to phase and frequency differences between an applied input signal corresponding to at least a portion of said first reference signal and representative of incremental differences therefrom and a second reference signal also responsive to said phase differences in closed loop configuration, for providing first and second error correction signals corresponding to polarities and magnitudes of said phase and frequency differences,
   logic gate means responsive to said first and second complementary signals and to said first and second phase error correction signals for providing signal frequency components in an additive manner corresponding to said first error correction signals and in a subtractive manner corresponding to said second error correction signals, and
   digital counter means, responsive to said additive and subtractive signal frequency components for providing a digital frequency count corresponding to said second reference signal, so that said second reference signal is urged to substantial identity in frequency and phase with said applied input signal.

2. The digital phase-lock loop circuit as set forth in claim 1, said digital logic means for providing first and second complementary signals further comprising bistable-multivibrator means.

3. The digital phase-lock loop circuit as set forth in claim 2, said bistable-multivibrator means further comprising a J-K reset-set logic circuit.

4. The digital phase-lock loop circuit as set forth in claim 3, wherein said logic gate means further comprises:
first and second AND logic gate means coupled to receive corresponding ones of said first and second complementary signals, said first and second AND gate means also coupled to receive signals from said first reference signal means, thereby to produce first and second clock signals in 180 phrase opposition.

5. The digital phase-lock loop circuit as set forth in claim 4, wherein said logic gate means further comprises:
first and second D type reset-set logic means, said first D-type logic means responsive to said first error correction signals and to said first clock signal, thereby to produce an output corresponding to a duration of said first error correction signal,
said second D-type logic means coupled to receive said second error correction signals and said second clock signal, thereby to produce a first output corresponding to a duration of said second error correction signal and a second output complementary to said first output.

6. The phase-lock loop circuit as set forth in claim 5, wherein said logic gate means further comprises:
first NAND logic gate means coupled to receive said second clock signal and said output of said first D-type logic means, for producing a signal corresponding to said second clock signal when activated by said first error correction signal applied to said first D-type logic means, said produced signal representative of a first frequency increment command,
second NAND logic gate means coupled to receive said first clock signal and said second output of said second D-type logic means, for producing a signal corresponding to said first clock signal when said second D-type logic means is in a first condition corresponding to the presence of said first error correction signal, and for producing a null output when said second D-type logic means is in a second condition activated by said second error correction signal,
said first condition representative of a second frequency increment command and said second condition representative of a frequency decrement command.

7. The phase-lock loop circuit as set forth in claim 6, wherein said logic gate means further comprises:
third AND gate means responsive to said first frequency increment command of said first NAND logic gate means and further responsive to said second frequency increment and said frequency decrement commands of said second NAND logic gate means, for producing a further frequency increment command when energized by said first and second frequency increment commands, and for producing a null output when energized only by one of said first or second frequency increment commands.

8. The phase-lock loop circuit as set forth in claim 7, further comprising frequency counter means, responsive to said further frequency increment command and to said null output of said third AND logic gate means, for producing said second reference signal in accordance with said first or second error correction signals, so that said frequency counter means responds to a discrepancy between said applied input signal and said second reference signal by counting pulses gated into said counter, thereby to advance or decrement the frequency or advance or retard the phase of said second reference signal to match said applied input signal.

9. The phase-lock loop system as set forth in claim 8, wherein said frequency counter means further comprises divide by N counter means, for producing said second reference signal substantially at the same frequency as said applied input signal.

10. The phase-lock loop circuit as set forth in claim 9, further comprising third NAND logic gate means responsive to said first clock signal and to said first output of said second D-type logic means, thereby to produce a further frequency decrement signal corresponding to said first clock signal when energized by said second error correction signal.

11. The phase-lock loop system as set forth in claim 10, further comprising UP/DOWN frequency counter means having a first terminal coupled to said produced output of said first NAND logic gate means and a second terminal coupled to receive said further frequency decrement signal of said third NAND logic gate means, thereby to produce a frequency count indicative of a substantially real-time frequency difference between said applied input signal and a subharmonic of said first reference signal.

* * * * *